(12) United States Patent
Fu et al.

(10) Patent No.: US 8,586,479 B2
(45) Date of Patent: Nov. 19, 2013

(54) METHODS FOR FORMING A CONTACT METAL LAYER IN SEMICONDUCTOR DEVICES

(75) Inventors: Xinyu Fu, Pleasanton, CA (US); Srinivas Gandikota, Santa Clara, CA (US); Sang Ho Yu, Cupertino, CA (US); Kavita Shah, Mountain View, CA (US); Yu Lei, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 173 days.

(21) Appl. No.: 13/356,002

(22) Filed: Jan. 23, 2012

(65) Prior Publication Data
US 2013/0189840 A1 Jul. 25, 2013

(51) Int. Cl.
*H01L 21/44* (2006.01)
(52) U.S. Cl.
USPC ........................ 438/680; 438/677; 438/637
(58) Field of Classification Search
USPC .......... 438/584, 637, 680, 677; 257/E21.161
See application file for complete search history.

(56) References Cited

U.S. PATENT DOCUMENTS

| | | | |
|---|---|---|---|
| 4,589,193 A | 5/1986 | Goth et al. | |
| 5,888,888 A | 3/1999 | Talwar et al. | |
| 6,207,487 B1 | 3/2001 | Kim et al. | |
| 6,242,808 B1 | 6/2001 | Shimizu et al. | |
| 6,251,242 B1 | 6/2001 | Fu et al. | |
| 6,277,249 B1 | 8/2001 | Gopalraja et al. | |
| 6,284,646 B1 | 9/2001 | Leem | |
| 6,305,314 B1 | 10/2001 | Sneh et al. | |
| 6,335,240 B1 | 1/2002 | Kim et al. | |
| 6,344,419 B1 | 2/2002 | Forster et al. | |
| 6,348,376 B2 | 2/2002 | Lim et al. | |
| 6,358,829 B2 | 3/2002 | Yoon et al. | |
| 6,372,598 B2 | 4/2002 | Kang et al. | |
| 6,399,491 B2 | 6/2002 | Jeon et al. | |
| 6,416,822 B1 | 7/2002 | Chiang et al. | |
| 6,428,859 B1 | 8/2002 | Chiang et al. | |
| 6,451,119 B2 | 9/2002 | Sneh et al. | |
| 6,451,695 B2 | 9/2002 | Sneh | |
| 6,458,701 B1 | 10/2002 | Chae et al. | |
| 6,464,779 B1 | 10/2002 | Powell et al. | |
| 6,468,924 B2 | 10/2002 | Lee et al. | |
| 6,475,910 B1 | 11/2002 | Sneh | |
| 6,478,872 B1 | 11/2002 | Chae et al. | |
| 6,482,262 B1 | 11/2002 | Elers et al. | |
| 6,482,733 B2 | 11/2002 | Raaijmakers et al. | |
| 6,482,740 B2 | 11/2002 | Soininen et al. | |
| 6,489,214 B2 | 12/2002 | Kim et al. | |
| 6,511,539 B1 | 1/2003 | Raaijmakers | |
| 6,534,395 B2 | 3/2003 | Werkhoven et al. | |
| 6,548,424 B2 | 4/2003 | Putkonen | |
| 6,551,929 B1 | 4/2003 | Kori et al. | |
| 6,569,501 B2 | 5/2003 | Chiang et al. | |
| 6,585,823 B1 | 7/2003 | Van Wijck | |

(Continued)

*Primary Examiner* — Jack Chen
(74) *Attorney, Agent, or Firm* — Patterson & Sheridan, LLP

(57) ABSTRACT

Methods for forming a contact metal layer in a contact structure in semiconductor devices are provided in the present invention. In one embodiment, a method for depositing a contact metal layer for forming a contact structure in a semiconductor device includes pulsing a deposition precursor gas mixture to a surface of a substrate disposed in a metal deposition processing chamber, pulsing a purge gas mixture to an edge of the substrate, wherein the purge gas mixture includes at least a hydrogen containing gas and an inert gas, and forming a contact metal layer on the substrate from the first deposition precursor gas mixture.

21 Claims, 4 Drawing Sheets

(56) References Cited

U.S. PATENT DOCUMENTS

| | | |
|---|---|---|
| 6,599,572 B2 | 7/2003 | Saanila et al. |
| 6,599,819 B1 | 7/2003 | Goto |
| 6,607,976 B2 | 8/2003 | Chen et al. |
| 6,620,670 B2 | 9/2003 | Song et al. |
| 6,620,723 B1 | 9/2003 | Byun et al. |
| 6,620,956 B2 | 9/2003 | Chen et al. |
| 6,630,201 B2 | 10/2003 | Chiang et al. |
| 6,632,279 B1 | 10/2003 | Ritala et al. |
| 6,660,660 B2 | 12/2003 | Haukka et al. |
| 6,686,271 B2 | 2/2004 | Raaijmakers et al. |
| 6,825,115 B1 | 11/2004 | Xiang et al. |
| 6,867,130 B1 | 3/2005 | Karlsson et al. |
| 6,897,118 B1 | 5/2005 | Poon et al. |
| 2003/0059538 A1 | 3/2003 | Chung et al. |
| 2005/0074956 A1 | 4/2005 | Autryve et al. |
| 2005/0186765 A1 | 8/2005 | Ma et al. |
| 2006/0079086 A1 | 4/2006 | Boit et al. |
| 2006/0091493 A1 | 5/2006 | Wu |
| 2006/0105515 A1 | 5/2006 | Amos et al. |
| 2006/0105557 A1 | 5/2006 | Klee et al. |
| 2007/0209931 A1 | 9/2007 | Miller |
| 2013/0189840 A1* | 7/2013 | Fu et al. .................. 438/680 |

\* cited by examiner

METHODS FOR FORMING A CONTACT METAL LAYER IN SEMICONDUCTOR DEVICES

BACKGROUND OF THE INVENTION

1. Field of the Invention

Embodiments of the invention generally relate to the field of semiconductor manufacturing processes, more particularly, to methods for annealing a contact metal layer disposed in contact structures for semiconductor devices.

2. Description of the Related Art

Integrated circuits may include more than one million micro-electronic field effect transistors (e.g., complementary metal-oxide-semiconductor (CMOS) field effect transistors) that are formed on a substrate (e.g., semiconductor wafer) and cooperate to perform various functions within the circuit. Reliably producing sub-half micron and smaller features is one of the key technologies for the next generation of very large scale integration (VLSI) and ultra large-scale integration (ULSI) of semiconductor devices. However, as the limits of integrated circuit technology are pushed, the shrinking dimensions of interconnects in VLSI and ULSI technology have placed additional demands on processing capabilities. Reliable formation of the gate pattern is important to integrated circuits success and to the continued effort to increase circuit density and quality of individual substrates and die.

As feature sizes have become smaller, the demand for higher aspect ratios, defined as the ratio between the depth of the feature and the width of the feature, has steadily increased to 20:1 and even greater. Typically, the contact structure usually includes a metal silicide, such as nickel silicide (NiSi), cobalt silicide ($CoSi_2$), or titanium silicide ($TiSi_2$) layer. Cobalt and nickel are becoming popular for using as contact metal layers in contact structures with smaller geometries, e.g., geometries having aspect ratios of about 20:1 or smaller, because using cobalt and nickel are widely available and have lower resistivity and lower contact resistance compared to other metal layers for forming metal silicides.

In a typical fabrication process, a pre-clean process is performed before the contact metal silicide layer is formed on a substrate in one vacuum environment. Subsequently, a contact metal layer is deposited on the substrate using a physical vapor deposition process. A variety of problems may occur when depositing contact metal layers into contact structures with small geometries, such as geometries having aspect ratios of about 20:1 or smaller. For example, a contact metal layer deposited using a conventional PVD process often suffers from poor step coverage, overhang, and voids formed within the via or trench when the via has a critical dimension of less than 50 nm or has an aspect ratio greater than 10:1. Insufficient deposition on the bottom and sidewall of the vias or trenches can also result in deposition discontinuity, thereby resulting in device shorting or poor interconnection formation. Furthermore, the contact metal layer may have poor adhesion over the underlying silicon containing layer, resulting in peeling of the contact metal layer from the substrate and the subsequent conductive metal layer.

Therefore, there is a need for an improved method for forming a contact metal layer in semiconductor device fabrication process.

SUMMARY OF THE INVENTION

Methods for forming a contact metal layer in a contact structure in a semiconductor device are provided by the present invention. In one embodiment, a method for depositing a contact metal layer for forming a contact structure in a semiconductor device pulsing a deposition precursor gas mixture to a surface of a substrate disposed in a metal deposition processing chamber, pulsing a purge gas mixture to an edge of the substrate, wherein the purge gas mixture includes at least a hydrogen containing gas and an inert gas, and forming a contact metal layer on the substrate from the first deposition precursor gas mixture.

In another embodiment, a method for depositing a contact metal layer for forming a contact structure in a semiconductor device includes supplying a pretreatment gas mixture into a metal deposition processing chamber to pretreat a surface of a substrate in the metal deposition processing chamber, pulsing a deposition precursor gas mixture to the surface of the substrate disposed in the metal deposition processing chamber, pulsing a purge gas mixture to an edge of the substrate, wherein the purge gas mixture includes at least a hydrogen containing gas and an inert gas, and forming a contact metal layer on the substrate from the deposition precursor gas mixture.

In yet another embodiment, a method for depositing a contact metal layer for forming a contact structure in a semiconductor device includes supplying a pretreatment gas mixture into a metal deposition processing chamber to pretreat a surface of a substrate in the metal deposition processing chamber, wherein the substrate has a silicon containing layer disposed thereon having openings formed in the silicon containing layer, the openings having aspect ratio greater than 20:1, pulsing a deposition precursor gas mixture to the surface of the substrate disposed in the metal deposition processing chamber, pulsing a purge gas mixture to an edge of the substrate, wherein the purge gas mixture includes at least a hydrogen containing gas and an inert gas, and forming a contact metal layer in the openings of the silicon containing layer disposed on the substrate from the deposition precursor gas mixture.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION OF THE INVENTION

As will be explained in greater detail below, a contact metal layer is deposited on a substrate to form a contact metal structure on the substrate. The term "substrate" as used herein refers to a layer of material that serves as a basis for subsequent processing operations and includes a surface to be disposed for forming a contact metal layer thereon. The substrate can also include one or more nonconductive materials, such as silicon, silicon oxide, doped silicon, germanium, gallium arsenide, glass, and sapphire. The substrate can also include dielectric materials such as silicon dioxide, organosilicates, and carbon doped silicon oxides. Further, the substrate can include any other materials such as metal nitrides and metal alloys, depending on the application. In one or more embodiments, the substrate can form a gate structure including a gate dielectric layer and a gate electrode layer to facilitate connecting with an interconnect feature, such as a plug, via, contact, line, and wire, subsequently formed thereon.

The term "contact structure" as used herein refers to a layer of material that includes a contact metal layer that can form part of a gate electrode. In one or more embodiments, the contact metal layer can be nickel layer, cobalt layer, titanium layer or any combinations thereof.

Moreover, the substrate is not limited to any particular size or shape. The substrate can be a round wafer having a 200 mm diameter, a 300 mm diameter or other diameters, such as 450 mm, among others. The substrate can also be any polygonal, square, rectangular, curved or otherwise non-circular workpiece, such as a polygonal glass substrate used in the fabrication of flat panel displays.

The present invention provides methods for depositing/forming a contact metal layer on a substrate to form a contact structure. The deposition process may efficiently improve deposited film step coverage, conformality, continuity and uniformity across the substrate, thereby improving the overall film properties formed across the substrate.

Figure 1:
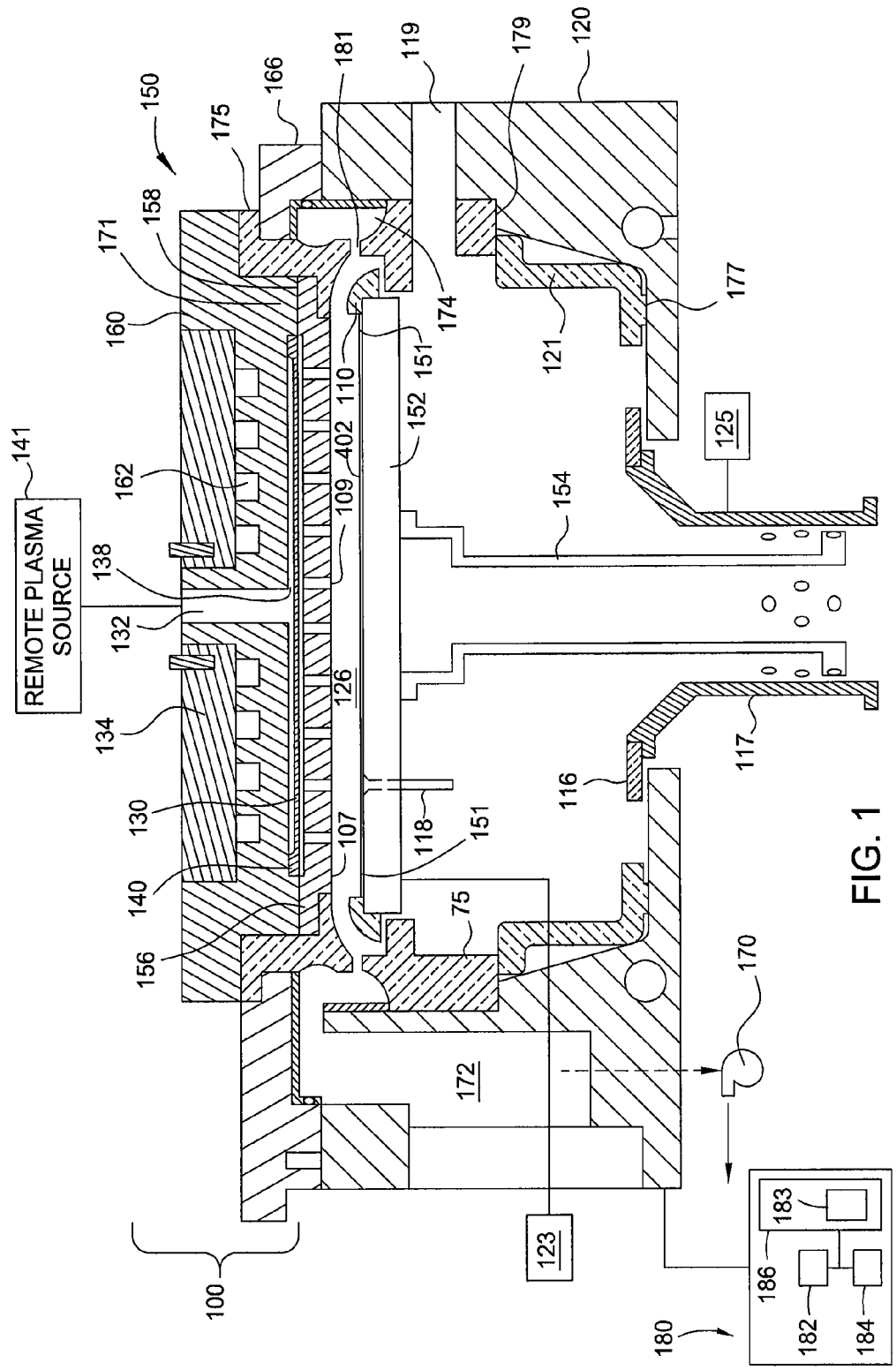
FIG. 1 depicts a sectional view of one embodiment of a metal deposition processing chamber suitable for performing one embodiment of the present invention.

FIG. 1 illustrates a processing chamber 150 that may be used to form contact metal materials by vapor deposition process as described herein. The contact metal materials may contain metallic cobalt, metallic tungsten, derivatives thereof, or combinations thereof. Processing chamber 150 may be used to perform CVD, PE-CVD, pulsed-CVD, ALD, PE-ALD, derivatives thereof, or combinations thereof. Water channels, such as convolute liquid channel 162, may be used to regulate the temperature of 11d assembly 100 during the vapor deposition process for depositing a cobalt-containing material. In one embodiment, lid assembly 100 may be heated or maintained at a temperature within a range from about 120° C. to about 180° C., preferably, from about 140° C. to about 160° C., and more preferably, from about 145° C. to about 155° C., such as about 150° C., during the vapor deposition process of a cobalt-containing material.

A showerhead 156 has a relatively short upwardly extending rim 158 screwed to gas box plate 160. Both the showerhead 156 and the gas box plate 160 may be formed from or contain a metal, such as aluminum, stainless steel, or alloys thereof. A convolute liquid channel 62 is formed in the top of the gas box plate 160 and covered and sealed by a water cooling cover plate 134. Water is generally flown through the convolute liquid channel 162. However, alcohols, glycol ethers, and other organic solvents may be used solely or mixed with water to transfer heat away from or to the lid assembly 100. The convolute liquid channel 162 is formed in a serpentine though generally circumferential path having bends (e.g., three sharp U-turns or U-shaped bends) as the path progresses from the inside to the outside until the path returns to the inside in a radial channel (not shown). A liquid channel 162 is narrow enough to ensure that the flow of water becomes turbulent, thus aiding the flow of heat from the flange of the gas box plate 160 to the water in channel 162. A liquid temperature regulating system (not shown) may be attached to the convolute liquid channel 162 and used to transfer heat away from or to lid assembly 100. In one example, the lid assembly 100 is configured to be heated or maintained at a temperature of about 150° C. and is in fluid communication with a source of cobalt precursor (e.g., CCTBA) and a source of a hydrogen precursor (e.g., $H_2$).

The extending rim 158 of showerhead 156 is attached to the bottom rim 72 of the gas box plate 160. Both the rims 158 and 72 are maximally sized between encompassing a lid isolator 175 and an encompassed lower cavity 130 of showerhead 156. The screw fastening between the showerhead 156 and the gas box plate 160 ensures good thermal contact over the maximally sized contact area. The thermal flow area extends from the outside at the lid isolator 175 (except for a gap between lid isolator 175 and either showerhead 156 or gas box plate 160) to the inside at a lower cavity 130. The structure of water cooling channels 162 provides efficient thermal transfer between the water and gas box plate 160, and the mechanical interface between the flange of gas box plate 160 and showerhead 156 ensures efficient thermal transfer between them. Accordingly, the cooling of showerhead 156 is greatly enhanced.

The processing chamber 150 further contains heater pedestal 152 connected to pedestal stem 54 that may be vertical moved within the processing chamber 150. The heater portion of heater pedestal 152 may be formed of a ceramic. In its upper, deposition position, the pedestal 152 holds a substrate 402 in close opposition to lower surface 107 of the showerhead 156, a processing region 126 being defined between pedestal 152 and lower surface 107 of showerhead 156. The showerhead 156 has a large number of apertures or holes 109 communicating between the lower cavity 130 and the processing region 126 to allow the passage of processing gas. The processing gas is supplied through the gas port 132 formed at the center of the water-cooled gas box plate 160 made of aluminum. The upper side of gas box plate 160 is covered by water cooling cover plate 134 surrounding the upper portion of gas box plate 160 that includes gas port 132. The gas port 132 supplies the processing gases to upper cavity 138 separated from lower cavity 130 by blocker plate 140, also having a large number of holes 109 therethrough. One purpose of cavities 130 and 138, showerhead 156, and blocker plate 140 is to evenly distribute the processing gas over the upper face of the substrate.

The substrate may be supported on pedestal 152, which is illustrated in a raised, deposition position. In a lowered, loading position, lifting ring 116 attached to lift tube 117 lifts four lift pins 118 fit to slide into pedestal 152 so that lift pins 118 can receive the substrate loaded into the chamber through loadlock port 119 in chamber body 120. In one embodiment, pedestal 152 may contain an optional confinement ring 10, such as during plasma-enhanced vapor deposition processes.

A purge gas source 123 may be coupled to the processing chamber 150 configured to supply purge gas to an edge portion 151 of the substrate 402 as needed. In one embodiment, the gases may be supplied from the purge gas source 123 to the substrate edge portion 151 may be a hydrogen gas, argon gas, nitrogen gas, helium gas, combinations thereof, or the like. Furthermore, a bottom purge gas source 125 may also be coupled to the chamber 150 to supply the purge gas from the bottom 86 of the chamber 150 to the substrate surface. Similarly, the purge gas supplied from the bottom purge gas source 125 may include a hydrogen gas, argon gas, nitrogen gas, helium gas, combinations thereof, or the like.

A lid isolator 175 is interposed between showerhead 156 and lid rim 166, which can be lifted off chamber body 120 to open processing chamber 150 for maintenance access. The vacuum within processing chamber 150 is maintained by vacuum pump 170 connected to pump plenum 171 within processing chamber 150, which connects to annular pumping channel 75.

An annular chamber liner 75 made of quartz disposed in the processing chamber 150 not only defines a side of pumping channel 75 but also partially defines a further choke aperture 181 between processing region 126 and pumping channel 75. The annular chamber liner 75 also supports confinement ring 10 in the lowered position of pedestal 152. The chamber liner 75 also surrounds a circumference at the back of pedestal 152. The chamber liner 75 rests on narrow ledge 83 in chamber body 120, but there is little other contact, so as to minimize thermal transport. Below chamber liner 75 is located a Z-shaped lower chamber shield 121, made of opaque quartz. The lower chamber shield 121 rests on the bottom of chamber body 120 on annular boss 86 formed on the bottom of the lower chamber shield 121. The quartz prevents radiative coupling between the bottom of pedestal 152 and chamber body 120, and annular boss 86 minimizes conductive heat transfer to chamber body 120. In an alternative embodiment, the lower chamber shield 121 includes an inwardly extending bottom lip joined to a conically shaped upper portion conforming to the inner wall of chamber body 120. While this alternative design is operationally satisfactory, the sloping shape is much more expensive to fabricate in quartz.

In one embodiment, a remote plasma source 141 may be coupled to the processing chamber 150 to the gas port 132 to supply reactive plasma source through the holes 109 in the showerhead 156 to the processing chamber 150 to the substrate surface. It is noted that the remote plasma source 141 may be coupled to the processing chamber 150 in any suitable position to supply a reactive remote plasma source to the substrate surface as needed. Suitable gases that may be supplied to the remote plasma source 141 to be dissociated and further delivered to the substrate surface include hydrogen, argon, helium, nitrogen, ammonia, combinations thereof and the like.

In FIG. 1, a control unit 180 may be coupled to the chamber 150 to control processing conditions. The control unit 180 comprises a central processing unit (CPU) 182, support circuitry 184, and memory 186 containing associated control software 183. The control unit 180 may be one of any form of general purpose computer processor that can be used in an industrial setting for controlling various chambers and sub-processors. The CPU 182 may use any suitable memory 186, such as random access memory, read only memory, floppy disk drive, compact disc drive, hard disk, or any other form of digital storage, local or remote. Various support circuits may be coupled to the CPU 182 for supporting the chamber 150. The control unit 180 may be coupled to another controller that is located adjacent individual chamber components. Bi-directional communications between the control unit 180 and various other components of the chamber 150 are handled through numerous signal cables collectively referred to as signal buses 188, some of which are illustrated in FIG. 1.

Figure 2:
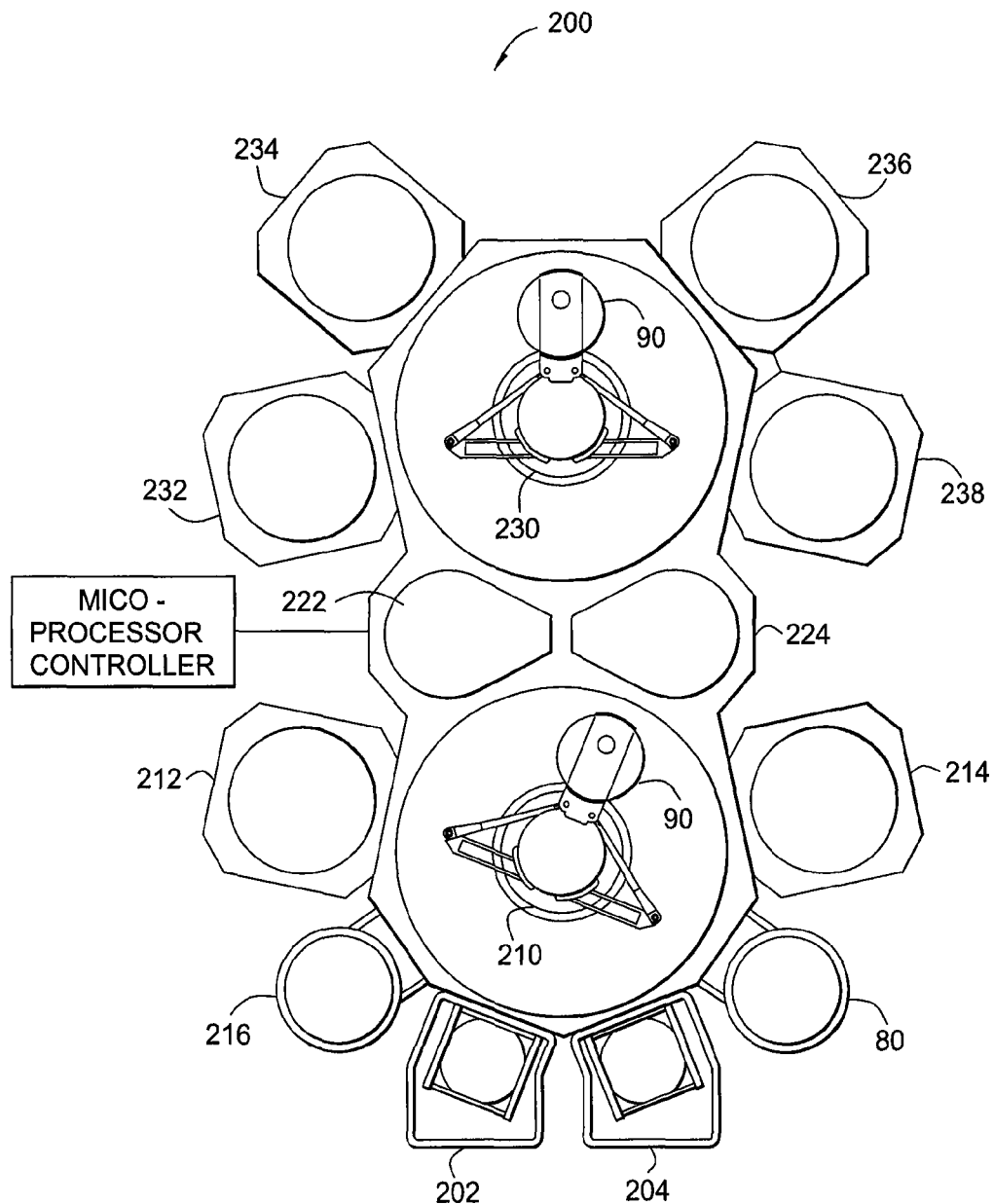
FIG. 2 is a schematic top-view diagram of an illustrative multi-chamber processing system having the metal deposition processing chamber of FIG. 1 incorporated therein.

FIG. 2 is a schematic top view diagram of an illustrative multi-chamber processing system 200 that can be adapted to perform a metal layer deposition process as disclosed herein having the processing chamber 150 integrated therewith. The system 200 can include one or more load lock chambers 202, 204 for transferring substrates into and out of the system 200. Typically, since the system 200 is under vacuum, the load lock chambers 202, 204 can be "pumped down" to introduce the substrates introduced into the system 200. A first robot 210 can transfer the substrates between the load lock chambers 202, 204, and a first set of one or more substrate processing chambers 212, 214, 216, 150 (four are shown). Each processing chamber 212, 214, 216 is configured to be at least one of substrate deposition process, such as cyclical layer deposition (CLD), atomic layer deposition (ALD), chemical vapor deposition (CVD), physical vapor deposition (PVD), etch, degas, pre-cleaning orientation and other substrate processes. Furthermore, one of the processing chamber 212, 214, 216 may also be configured to perform a pre-clean process prior to performing a deposition process or a thermal annealing process to the substrate. The position of the processing chamber 150 utilized to perform a thermal annealing process relative to the other chambers 212, 214, 216 is for illustration, and the position of the processing chamber 150 may be optionally be switched with any one of the processing chambers 212, 214, 216 if desired.

The first robot 210 can also transfer substrates to/from one or more transfer chambers 222, 224. The transfer chambers 222, 224 can be used to maintain ultrahigh vacuum conditions while allowing substrates to be transferred within the system 200. A second robot 230 can transfer the substrates between the transfer chambers 222, 224 and a second set of one or more processing chambers 232, 234, 236, 238. Similar to processing chambers 212, 214, 216, 150, the processing chambers 232, 234, 236, 238 can be outfitted to perform a variety of substrate processing operations including the dry etch processes described herein in addition to cyclical layer deposition (CLD), atomic layer deposition (ALD), chemical vapor deposition (CVD), physical vapor deposition (PVD), etch, pre-clean, degas, and orientation, for example. Any of the substrate processing chambers 212, 214, 216, 232, 234, 236, 238 can be removed from the system 200 if not necessary for a particular process to be performed by the system 200. After the preclean, deposition and/or an thermal annealing process is performed in any one of the processing chamber 150, the substrate may further be transferred to any of the processing chambers 212, 214, 216, 232, 234, 236, 238 of the system 200 to perform other process as needed.

Figure 3:
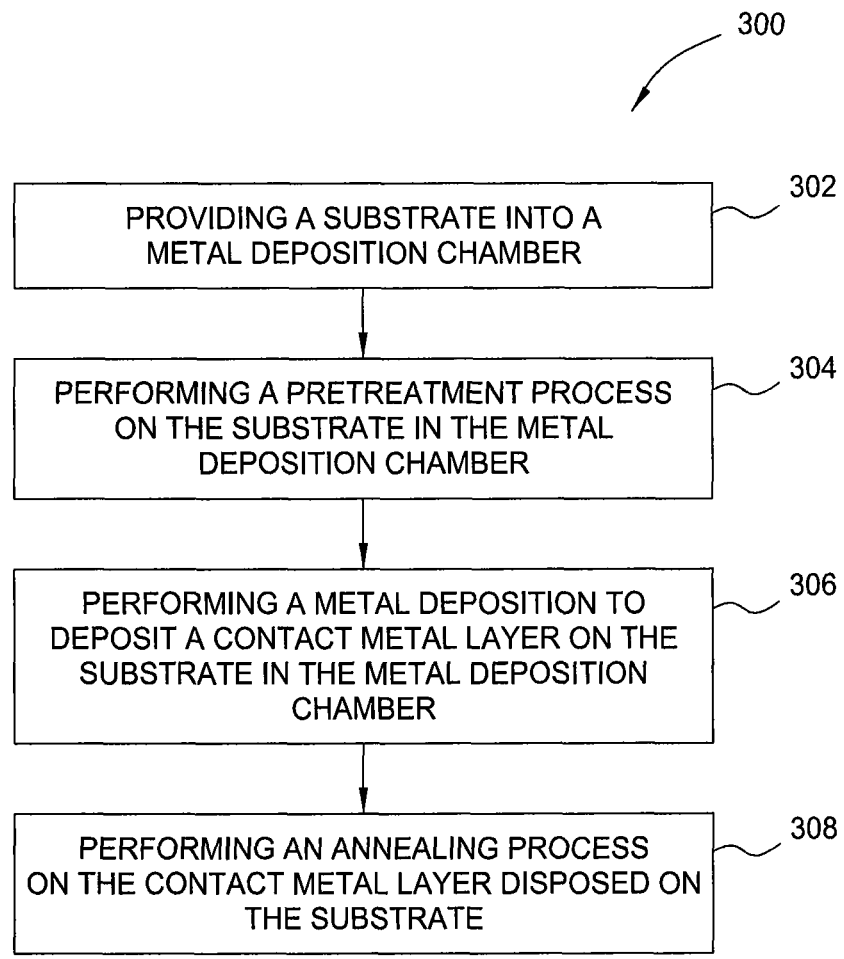
FIG. 3 depicts a flow diagram for forming a contact metal layer in a semiconductor device in accordance with one embodiment of the present invention.
Figure 4A:
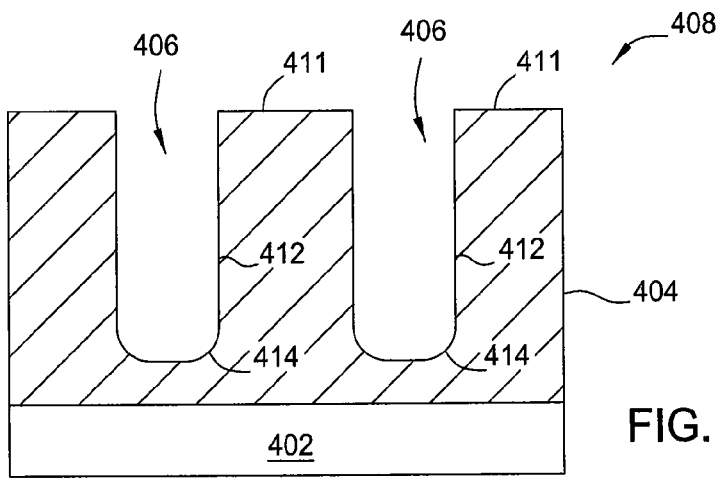
FIGS. 4A-4C depict cross-sectional views of a semiconductor device during the formation of a contact metal layer manufacture process in accordance with one embodiment of the present invention.
Figure 4B:
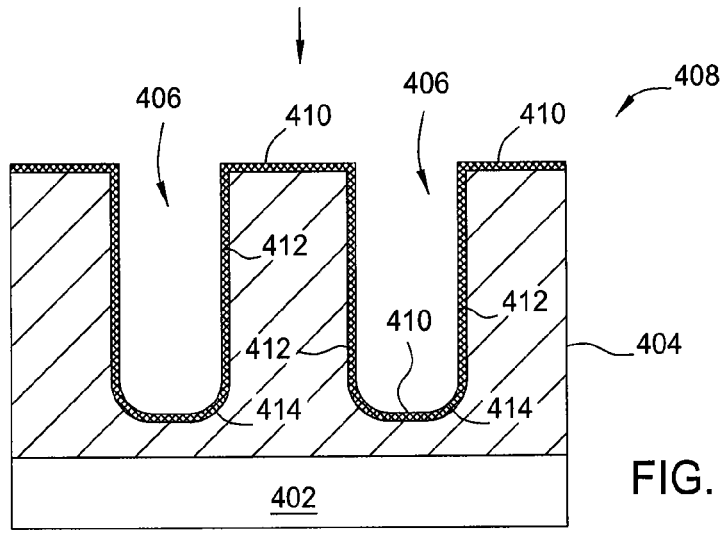
Figure 4C:
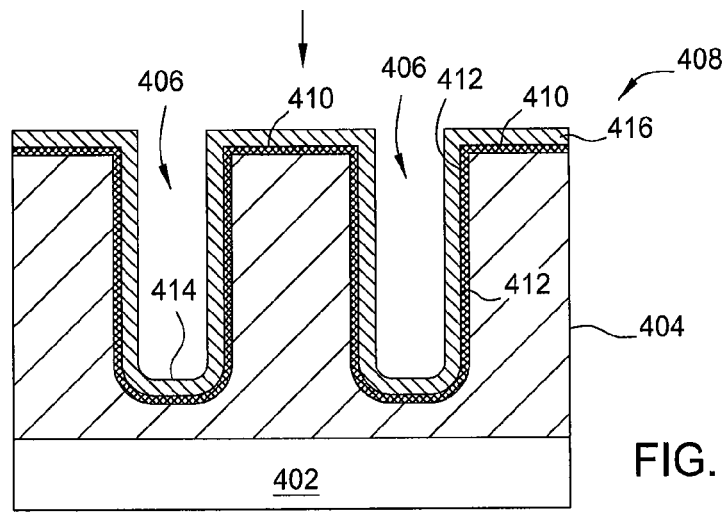

FIG. 3 illustrates a flow diagram of one embodiment of a process sequence 300 used to deposit a contact metal layer in a semiconductor device structure on a substrate. The sequence described in FIG. 3 corresponds to the fabrication stages depicted in FIGS. 4A-4C, which are discussed below. FIGS. 4A-4C illustrate schematic cross-sectional views of a substrate 402 having a device structure 408 formed thereon during different stages of fabricating a contact metal layer on the device structure 408 illustrated by the processing sequence 300.

The process sequence 300 starts at step 302 by providing a substrate, such as the substrate 402 depicted in FIG. 4A, into the processing chamber, such as the substrate 90 disposed in the processing chamber 150 depicted in FIG. 1, or other suitable processing chamber. The substrate 402 shown in FIG. 4A includes a semiconductor device structure 400 (e.g., such as a gate structure or other structures configured to form a contact structure) formed on the substrate 402. It is noted that this particular device structure 400 may be used in threedimensional (3-D) flash memory applications, DRAM applications, or other suitable applications with high aspect ratio or other odd geometries.

In one embodiment, the substrate 402 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOD, carbon doped silicon oxides, silicon nitride, doped silicon, germanium, gallium arsenide, glass, sapphire. The substrate 402 may have various dimensions, such as 200 mm, 300 mm or 450 mm diameter wafers or other dimensions, as well as, rectangular or square panels. Unless otherwise noted, embodiments and examples described herein may be conducted on substrates with a 200 mm diameter, a 300 mm diameter, or a 450 mm diameter, particularly a 300 mm diameter.

A silicon containing layer 404 is formed on the substrate 402 having openings 406 with high aspect ratio, such as aspect ratios greater than 10:1, for example about greater than 20:1, formed therein. The opening 406 (which may be a contact opening, contact via, contact trench, contact channel or the like) is formed in the device structure 408 and has sidewalls 412 and a bottom 414 which form an open cannel to expose the underlying silicon containing layer 404. The silicon containing layer 404 may include any suitable layers such as a single silicon layer or a multiple layer film stack having at least one silicon containing layer formed therein. In the embodiment wherein the silicon containing layer 404 is in form of a single layer, the silicon containing layer 404 may be a silicon oxide layer, an oxide layer, a silicon nitride layer, a nitride layer, a silicon oxynitride layer, a titanium nitride layer, a polysilicon layer, a microcrystalline silicon layer, a monocrystalline silicon, a doped polysilicon layer, a doped microcrystalline silicon layer or a doped monocrystalline silicon. In another example, the silicon containing layer 404 may be a film stack including a composite oxide and nitride layer, at least one or more oxide layers sandwiching a nitride layer, and combinations thereof. Suitable dopants doped in the silicon containing layer 404 may include p-type dopants and n-type dopants, such as boron (B) containing dopants or phosphine (P) containing dopants. In the embodiment wherein the silicon containing layer 404 is in form of a multiple film stack having at least one silicon containing layer, the silicon containing layer 404 may include repeating pairs of layers including a silicon containing layer and a dielectric layer. In one embodiment, the silicon containing layer 404 may include a polysilicon layer and/or other metal materials and/or a dielectric layer disposed therein. Suitable examples of the dielectric layer is selected from a group consisting of an oxide layer, silicon oxide layer, a silicon nitride layer, a nitride layer, titanium nitride layer, a composite of oxide and nitride layer, at least one or more oxide layers sandwiching a nitride layer, and combinations thereof, among others.

Furthermore, prior to transferring the substrate 402 into the metal deposition processing chamber described at step 302, a pre-cleaning process is optionally performed to treat the substrate surfaces 411, sidewall 412 and bottom 414 of the openings 406 to remove native oxides or other source of contaminants. Removal of native oxides or other source of contaminants from the substrate 402 may provide a low contact resistance surface to form a good contact surface for forming a contact metal layer.

The pre-cleaning process performed includes supplying a pre-cleaning gas mixture into a pre-cleaning chamber. The pre-cleaning chamber may be a Preclean PCII, PCXT or Siconi chambers which are available from Applied Materials, Santa Clara, Calif. The pre-cleaning chamber may be incorporated in the illustrative multi-chamber processing system 200 and may be configured to be one of the processing chamber 212, 214, 216, 232, 234, 236, 238 of the system 200 as needed. It is noted that other pre-cleaning chambers available from other manufactures may also be utilized to practice the present invention.

The pre-cleaning process is performed by supplying a cleaning gas mixture into the pre-cleaning processing chamber incorporated in the system 200 to form a plasma from the pre-cleaning gas mixture for removing the native oxide. In one embodiment, the pre-cleaning gas mixture used to remove native oxides is a mixture of ammonia ($NH_3$) and nitrogen trifluoride ($NF_3$) gases. The amount of each gas introduced into the processing chamber may be varied and adjusted to accommodate, for example, the thickness of the native oxide layer to be removed, the geometry of the substrate being cleaned, the volume capacity of the plasma, the volume capacity of the chamber body, as well as the capabilities of the vacuum system coupled to the chamber body.

In one or more embodiments, the gases added to provide a pre-cleaning gas mixture having at least a 1:1 molar ratio of ammonia ($NH_3$) to nitrogen trifluoride ($NF_3$). In one or more embodiments, the molar ratio of the pre-cleaning gas mixture is at least about 3:1 (ammonia to nitrogen trifluoride). The gases are introduced at a molar ratio of from about 5:1 (ammonia to nitrogen trifluoride) to about 30:1. In yet another embodiment, the molar ratio of the gas mixture is from about 5:1 (ammonia to nitrogen trifluoride) to about 10:1. The molar ratio of the pre-cleaning gas mixture can also fall between about 10:1 (ammonia to nitrogen trifluoride) and about 20:1.

A purge gas or carrier gas can also be added to the pre-cleaning gas mixture. Any suitable purge/carrier gas can be used, such as argon, helium, hydrogen, nitrogen, or mixtures thereof. The overall pre-cleaning gas mixture is from about 0.05% to about 20% by volume of ammonia and nitrogen trifluoride. The remainder of the pre-cleaning gas mixture may be the purge/carrier gas.

The operating pressure within the pre-clean chamber can be varied. The pressure may be maintained between about 1 Torr and about 10 Torr. A RF source power may be applied to maintain a plasma in the cleaning gas mixture. For example, a power of about 15 Watts to about 100 Watts may be applied to maintain a plasma inside the pre-cleaning processing chamber. The frequency at which the power is applied around 350 kHz. The frequency can range from about 50 kHz to about 350 kHz. The plasma energy dissociates the ammonia and nitrogen trifluoride gases into reactive species, e.g. fluorine radicals and/or hydrogen radicals, that combine to form a highly reactive ammonia fluoride ($NH_4F$) compound and/or ammonium hydrogen fluoride ($NH_4F.HF$) in the gas phase. These molecules are then delivered from the plasma location to the substrate surface to be cleaned. A purge/carrier gas can be used to facilitate the delivery of the reactive species to the substrate.

At step 304, prior to deposition of a contact metal layer on the substrate 402 but after the substrate 402 is provided in the metal deposition processing chamber 150 at step 302, a pre-treatment process may be performed to pre-treat the substrate surface 411, forming a treated surface region 410 on the surface 411, sidewall 412 and bottom 414 of the openings 406 in the silicon containing layer 404, as shown in FIG. 4B. In certain embodiments, the substrate surface 411 may have some week or residual dangling bonding structures of Si—F, N—F, H—F, Si—N on the substrate surface left from the optional pre-cleaning process previously performed on the substrate 402, which may undesirably and adversely obstruct the absorption or adherence of the metallic atoms to deposit on the substrate surface in the subsequent contact metal deposition process. Thus, the pretreatment process at step 304 may be performed to efficiently alter the surface bonding structure of the surface 411 of the silicon containing layer 404, thereby providing a surface having a good absorption ability to promote adherence of metallic atoms provided from the subsequent contact metal deposition process. It is believed that the pretreatment process may efficiently convert or remove the bonding structure of Si—F, H—F, N—F, Si—N, into the bonding of Si—H or Si—Si, which may assist adherence of the metallic atoms to form a layer thereon.

In one embodiment, a pre-treatment gas mixture may be supplied into the metal deposition processing chamber 150 to alter the surface properties of the substrate 402 prior to the contact metal deposition process. In one embodiment, the pre-treatment gas mixture may include at least a hydrogen containing gas, such as $H_2$, $H_2O$, $H_2O_2$, or the like. An inert gas, such as Ar, He, Kr, and the like, may also be supplied into the pre-treatment gas mixture.

Additionally, a nitrogen containing gas, such as $N_2$, $NH_3$, $N_2O$, $NO_2$, and the like, may also be supplied into the pre-treatment gas mixture. In an exemplary embodiment, the pre-treatment gas mixture supplied to pre-treat the substrate surface 411 includes a hydrogen containing gas, such as a $H_2$ gas and an inert gas, such as Ar gas. In another exemplary embodiment, the pre-treatment gas mixture supplied to pre-treat the substrate surface 411 includes a hydrogen containing gas, such as a $H_2$ gas, an inert gas, such as Ar gas and a nitrogen containing gas, such as a $NH_3$ gas.

The pre-treatment gas mixture may be supplied from a remote plasma source, such as the remote plasma source 141 coupled to the metal deposition processing chamber 150, to supply the pre-treatment gas mixture plasma remotely from the processing chamber 150 to the substrate surface 411. Alternatively, the pre-treatment gas mixture may be supplied from any other suitable sources installed in the processing chamber 150 to the substrate surface 411.

During the pretreatment process at step 304, several process parameters may be regulated to control the pretreatment process. In one exemplary embodiment, a process pressure in the metal deposition processing chamber 150 is regulated between about 50 mTorr to about 5000 mTorr, such as between about 500 mTorr and about 1000 mTorr, for example, at about 700 mTorr. A RF source power may be applied to maintain a plasma in the pretreatment gas mixture. For example, a power of about 1000 Watts to about 6000 Watts may be applied to maintain a plasma inside the processing chamber 150. The hydrogen containing gas supplied in the pretreatment gas mixture may be flowed into the chamber at a rate between about 400 sccm to about 4000 sccm and the inert gas supplied in the pretreatment gas mixture may be flowed at a rate between about 200 sccm and about 2000 sccm. The nitrogen containing gas supplied in the pretreatment gas mixture may be flowed at a rate between about 100 sccm and about 1000 sccm. A substrate temperature is maintained between about 125 degrees Celsius to about 250 degrees Celsius. In one embodiment, the substrate is subjected to perform the pretreatment process for between about 10 seconds to about 2 minutes, depending on the operating temperature, pressure and flow rate of the gas. For example, the substrate 402 can be exposed for about 30 seconds to about 60 seconds. In an exemplary embodiment, the substrate is exposed for about 40 seconds or less.

At step 306, after the pre-treatment process is performed on the substrate surface to form the treated region 410, a contact metal deposition process may be performed in the processing chamber 150 to deposit a contact metal layer 416, as shown in FIG. 4C. The contact metal layer 416 is formed conformally on sidewalls 412 and bottom 414 of the opening 406. The contact metal layer 416 is a metal layer which may be later utilized to form a metal silicide layer after a thermal annealing process, which will be further discussed below. Suitable examples of the contact metal layer 416 include tungsten (W), titanium (Ti), hafnium (Hf), cobalt (Co), nickel (Ni), alloys thereof, or any combination thereof. In one particular embodiment described therein, the contact metal layer 416 deposited on the substrate 402 is a cobalt (Co) layer.

During the contact metal deposition process, the contact metal layer 416 may be formed or deposited by introducing a deposition precursor gas mixture including a cobalt precursor simultaneously with, sequentially with, or alternatively without a reducing gas mixture (or called reagent), such as a hydrogen gas ($H_2$) or a $NH_3$ gas, into the metal deposition processing chamber 150 during a thermal CVD process, a pulsed—CVD process, a PE-CVD process, a pulsed PE-CVD process, or a thermal ALD process. Additionally, the deposition precursor gas mixture may also include purge gas mixture to concurrently supply into the processing chamber for processing. In another embodiment, the contact metal layer 416 may be formed or deposited by sequentially repetitively introducing a pulse of deposition precursor gas mixture, such as a cobalt precursor, and a pulse of a reducing gas mixture, such as a hydrogen gas ($H_2$) or a $NH_3$ gas, into the metal deposition processing chamber 150 during a thermal ALD process or a pulsed PE-CVD process. Suitable cobalt precursors may include, but not limited to, cobalt carbonyl complexes, cobalt amidinates compounds, cobaltocene compounds, cobalt dienyl complexes, cobalt nitrosyl complexes, derivatives thereof, complexes thereof, plasmas thereof, or combinations thereof. In one embodiment, examples of the cobalt precursors that may be used herein include dicobalt hexacarbonyl butylacetylene (CCTBA, $(CO)_6Co_2$(HC≡C'Bu)), dicobalt hexacarbonyl methylbutylacetylene ($(CO)_6Co_2$(MeC≡C'Bu)), dicobalt hexacarbonyl phenylacetylene ($(CO)_6Co_2$(HC≡CPh)), hexacarbonyl methyl phenylacetylene ($(CO)_6Co_2$(MeC≡CPh)), dicobalt hexacarbonyl methylacetylene ($(CO)_6Co_2$(HC≡CMe)), dicobalt hexacarbonyl dimethylacetylene ($(CO)_6Co_2$(MeC≡CMe)), derivatives thereof, complexes thereof, plasmas thereof, or combinations thereof. Other exemplary cobalt carbonyl complexes include cyclopentadienyl cobalt bis(carbonyl) (CpCo $(CO)_2$), tricarbonyl allyl cobalt ($(CO)_3Co(CH_2CH$=$CH_2)$), derivatives thereof, complexes thereof, plasmas thereof, or combinations thereof. In one particular example of the cobalt precursors used herein is dicobalt hexacarbonyl butylacetylene (CCTBA, $(CO)_6Co_2$(HC≡C'Bu)). It is noted that the dicobalt hexacarbonyl butylacetylene (CCTBA, $(CO)_6Co_2$ (HC≡C'Bu)) precursor may be supplied into the metal deposition processing chamber 150 with a carrier gas, such as a Ar gas.

Examples of the alternative reagents (i.e., reducing agents used with cobalt precursors for forming the cobalt materials during the deposition process as described herein may include hydrogen (e.g., $H_2$ or atomic-H), nitrogen (e.g., $N_2$ or atomic-N), ammonia ($NH_3$), hydrazine ($N_2H_4$), a hydrogen and ammonia mixture ($H_2/NH_3$), borane ($BH_3$), diborane ($B_2H_6$), triethylborane ($Et_3B$), silane ($SiH_4$), disilane ($Si_2H_6$), trisilane ($Si_3H_8$), tetrasilane ($Si_4H_{10}$), methyl silane ($SiCH_6$), dimethylsilane ($SiC_2H_8$), phosphine ($PH_3$), derivatives thereof, plasmas thereof, or combinations thereof. In one particular example of the reagents or reducing agents used herein is ammonia ($NH_3$).

During the deposition process at step 306, in between each pulse of the deposition precursor, which may include the deposition precursor, reducing gas mixture and/or a purge gas mixture, a purge gas mixture may be supplied from a side/edge and/or a bottom of the processing chamber 150 in between each or selected deposition precursor pulses to the edge portion 151 of the substrate 402. The purge gas mixture may be supplied from the side and/or bottom gas source 123, 125 disposed in the processing chamber 150 to supply the purge gas mixture to an edge/periphery of the substrate surface. It is noted that the edge/periphery region of the substrate 402 as described herein may refer to a substrate edge region between about 1 mm and about 5 mm from the substrate edge/bevel for a 300 mm substrate or between about 145 mm and about 149 mm from the substrate center point/center line (e.g. a diameter passing through the substrate center point).

In one embodiment, the purge gas mixture supplied in the contact metal deposition process may include at least a hydrogen containing gas and an inert gas. It is noted that the purge gas mixture may be supplied with the deposition precursor gas mixture during the deposition process as needed. Suitable examples of the hydrogen containing gas may include $H_2$, $H_2O$, $H_2O_2$ or the like. Suitable examples of the inert gas include Ar, He or Kr. In one particular embodiment, the purge gas mixture supplied during the metal deposition process may include $H_2$ and Ar gas.

It is believed that supplying the purge gas mixture toward the edge portion 151 of the substrate 402 and/or from the bottom of the processing chamber may assist to have an increased $H_2$ flux density around the substrate edge, thereby improving the deposited contact metal layer uniformity. Furthermore, the purge gas mixture may also assist purging out the undesired impurities that may be present in the processing chamber during processing, thereby efficiently improving the film quality and purity, thus efficiently reducing contact metal layer resistivity and improving device performance.

In one embodiment of the deposition process, a pulse of the deposition precursor gas mixture along with a reducing gas and a purge gas mixture is supplied to the deposition chamber 150. The term pulse as used herein refers to a dose of material injected into the process chamber. The pulse of the deposition precursor gas mixture lasts for a predetermined time interval. Between each pulse of the deposition precursor gas mixture, the purge gas mixture may be pulsed into the processing chamber in between each or multiple pulses of the deposition precursor gas mixture to remove the impurities or residual precursor gas mixture which is unreacted/non-absorbed by the substrate surface (e.g., unreacted carbon containing impurities from the cobalt precursor or others) so they can be pumped out of the processing chamber.

The time interval for the pulse of the deposition precursor gas mixture is variable depending on a number of factors such as, film thickness requirement, process chamber volume, throughput concern, gas flow rate and the like. In one embodiment, the process conditions are advantageously selected so that a pulse of the deposition precursor gas mixture provides a sufficient amount of precursor, such that at least a monolayer of the cobalt metal precursor is adsorbed on the substrate. Thereafter, excess cobalt metal precursor remaining in the chamber may be removed from the processing chamber and pumped out by the purge gas mixture.

In some embodiment, the reducing gas mixture may be supplied concurrently with the deposition precursor gas mixture in a single pulse to form the contact metal layer 416. In one embodiment depicted herein, the pulse of the reducing gases may be co-flowed with the deposition precursor gas mixture after first few pulses, such as between first to fifth pulses, of the deposition precursor gas mixture.

In operation at step 306, a first pulse of the deposition precursor gas mixture is pulsed into the processing chamber 150 to form a first monolayer of the cobalt contact metal layer 416. Each pulse of the deposition precursor gas mixture into the processing chamber 150 may deposit a cobalt layer having a thickness between about 3 Å and about 5 Å. During pulsing of the deposition precursor gas mixture, several process parameters are also regulated. In one embodiment, the process pressure is controlled at between about 7 Torr and about 30 Torr. The processing temperature is between about 125 degrees Celsius and about 250 degrees Celsius. The RF power may be controlled at between about 100 Watts and about 800 Watts. The cobalt gas precursor supplied in the deposition precursor gas mixture may be controlled at between about 1 sccm and about 10 sccm. The reducing gas, such as the $NH_3$ gas, may be supplied at between about 100 sccm and about 700 sccm. The $H_2$ gas supplied from the substrate edge/substrate bottom may be controlled at between about 200 sccm and about 1000 sccm. The Ar gas may be supplied from the substrate edge/substrate bottom at between about 200 sccm and about 1000 sccm.

After pulsing of the deposition precursor gas mixture, a purge gas mixture is then supplied into the processing chamber to purge out the residuals and impurities from the processing chamber. During pulsing of the purge gas mixture, the process pressure may be pumped down to a certain low level, such as lower than 2 Torr, for example lower than 0.5 Torr, at a relatively short time interval, such as between about 1 seconds and about 5 seconds, so as to assist rapidly pumping out the residuals and impurities from the processing chamber. Several process parameters are also regulated during pulsing of the purge gas mixture. In one embodiment, the process pressure is controlled at between about 0.1 Torr and about 2 Torr, such as 0.1 Torr and about 1 Torr, for example between about 0.1 Torr and about 0.6 Torr. The processing temperature is between about 125 degrees Celsius and about 250 degrees Celsius. The RF power may be controlled at between about 100 Watts and about 800 Watts. The $H_2$ gas supplied in the purge gas mixture may be controlled at between about 200 sccm and about 1000 sccm. The Ar gas may be supplied at between about 200 sccm and about 1000 sccm.

Subsequent to the pulse of the purge gas mixture, additional cycles starting from the pulsing of the deposition precursor gas mixture followed with the pulse of the purge gas mixture can then be repeatedly performed until a desired thickness range of the contact metal layer 416 is reached. When a subsequent cycle of pulsing the deposition precursor gas mixture starts, the process pressure may be regulated to the predetermined level to assist depositing a subsequent monolayer of contact metal layer 416.

The duration between each pulse of the deposition precursor gas mixture and the purge gas mixture is controlled at between about 5 seconds and about 15 seconds.

It is noted that after a few cycles of the deposition precursor gas mixtures and the purge gas mixture, such as after one to five cycles, the reducing gas supplied in the deposition precursor gas mixture may be eliminated, leaving only the pulses of deposition precursor gas mixture (including precursor gas mixture and purge gas mixture) and the purge gas mixture to be supplied in the processing chamber for forming the contact metal layer 416.

It is noted that the process at step 304 and 306 may be included in one recipe performed at different steps included in a single recipe stored in the controller 180 of the processing chamber 150.

At step 308, a thermal annealing process is performed in a thermal annealing chamber on the substrate 402 to convert the contact metal layer 416 into a metal silicidation layer. The thermal annealing chamber may be one of the chambers processing chamber 212, 214, 216, 232, 234, 236, 238 of the system 200 as needed. In one embodiment, the thermal annealing process performed at step 308 to execute the silicidation process may have a temperature range between about 400 degrees Celsius and about 1400 degrees Celsius, such as between about 200 degrees Celsius and about 500 degrees Celsius. During the thermal annealing process, a gas mixture including at least a nitrogen containing gas is supplied into the annealing chamber. It is believed that the nitrogen containing gas supplied during the annealing process may assist increasing crystallinity of the metal silicide layer formed on the substrate 402. It is believed that portion of the nitrogen elements supplied in the nitrogen containing gas may be incorporated into the metal silicide layer, forming a metal silicide nitride layer, which may assist enhancing plane (111) orientation of the resultant metal silicide layer, thereby increasing the crystallinity of the metal silicide layer. It is believed that high crystallinity of the metal silicide layer may assist reducing contact resistance in semiconductor devices, thereby advantageously improving device performance.

In one embodiment, the thermal annealing process at 308 may be performed by supplying a gas mixture including at least a nitrogen containing gas into the annealing chamber at a flow rate between about 100 sccm and about 2000 sccm, controlling a chamber pressure of about 0.5 Torr and about 15 Torr, maintaining a temperature range between about 200 degrees Celsius and about 500 degrees Celsius and performing the thermal annealing process, optionally while rotating the substrate, for between about 30 seconds and about 180 seconds to form the metal silicide layer. Suitable examples of the nitrogen containing gas include nitrogen gas, ammonia gas, or nitrogen oxide. In one particular embodiment described herein, the nitrogen containing gas is a nitrogen gas ($N_2$).

In another embodiment, the gas mixture supplied in the thermal annealing chamber may further includes a hydrogen gas, an inert gas or other gases as needed. In one embodiment, the gas mixture supplied into the processing chamber to perform the silicidation process includes a nitrogen gas ($N_2$) and a hydrogen gas ($H_2$) supplied at a flow ratio between about 1:10 and about 1:1, such as about 1:3. In the embodiment wherein the silicon containing layer 404 are silicon layers without dopants doped therein, the gas mixture including a nitrogen gas ($N_2$) and a hydrogen gas may be used to perform the thermal annealing process. In the embodiment wherein a more amorphous-type metal silicide layer is desired, a pure hydrogen gas may be supplied to the thermal processing chamber to have the resultant metal silicide layer more amorphous oriented, instead of having high crystallinity in plane (111) orientation.

An example of a suitable thermal processing chamber, in which step 308 may be performed, is a dual mode degas (DMD) chamber, available from Applied Materials, Inc. It is noted that other thermal annealing chamber available from other manufactures may also be utilized to practice the present invention.

After the thermal annealing process is completed, the unreacted contact metal layer 416 lining on the sidewalls 412 of the silicon containing layer 404 may be removed by any suitable etching process. Any conventional suitable etching process that is available to remove the unreacted contact metal layer 416 may be utilized herein to assist removing the unreacted contact metal layer 416 from the substrate.

Furthermore, after the unreacted contact metal layer 416 is removed from the substrate, an additional thermal annealing process may be performed. The additional thermal annealing process may be any conventional thermal annealing process available in the art to provide thermal energy to the substrate 402. This particular additional thermal annealing process may be utilized to active dopants in the substrate, or any layers disposed on the substrate 402. In addition, this additionally annealing process may also be utilized to help complete the metal silicidation process as needed. In one embodiment, the additional thermal annealing process may be performed by a conventional RTP process. The thermal annealing process is performed by a rapid thermal annealing (RTA) processing between about 2 second and 50 seconds and maintaining substrate temperature at between about 800 degrees Celsius and about 1200 degrees Celsius. It is noted that annealing process, including process time and temperature, may be varied based on different elemental dopants and dopant concentrations in the devices. An example of a suitable RTP chamber is the CENTURA™ RADIANCE™ RTP chamber, available from Applied Materials, Inc., Santa Clara, Calif. Other annealing chambers, including those from other manufacturers, may be utilized to perform the additional thermal anneal process. In another embodiment, the thermal annealing process may be performed by other suitable annealing process including a laser annealing process, a dynamic surface annealing (DSA) process or the like.

Thus, methods for forming a contact metal layer in a contact structure are provided in the present invention. The contact metal deposition process may utilize a hydrogen containing gas and inert gas or optional a nitrogen containing gas mixture to pre-treat a substrate surface and followed by a contact metal deposition process utilizing a purge gas mixture including a hydrogen containing gas and a inert gas to assist removing impurities during the deposition process. The purge gas mixture including the hydrogen containing gas and the inert gas may assist instantly removes deposit by-products and impurities formed during the deposition process from the processing chamber, thereby improving the deposited contact metal layer uniformity. It is also believed that performing all these steps in one recipe in a single chamber may efficiently improve device performance by eliminating likelihood of contamination during transfer and reduce the overall manufacture cost.

While the foregoing is directed to embodiments of the present invention, other and further embodiments of the invention may be devised without departing from the basic scope thereof, and the scope thereof is determined by the claims that follow.

The invention claimed is:

1. A method for depositing a contact metal layer for forming a contact structure in a semiconductor device, comprising:
    pulsing a deposition precursor gas mixture to a surface of a substrate disposed in a metal deposition processing chamber;
    pulsing a purge gas mixture to an edge of the substrate, wherein the purge gas mixture includes at least a hydrogen containing gas and an inert gas; and
    forming a contact metal layer on the substrate from the deposition precursor gas mixture.

2. The method of claim 1, wherein the hydrogen containing gas in the gas mixture includes at least one of $H_2$ gas, $H_2O$, gas or $H_2O_2$ gas.

3. The method of claim 1, wherein the purge gas mixture includes $H_2$ gas and Ar gas.

4. The method of claim 1, wherein the deposition precursor gas mixture includes a cobalt containing precursor, $H_2$, and $NH_3$ gas.

5. The method of claim 1, wherein pulsing the deposition precursor gas further comprises:
pulsing the purge gas mixture into the metal deposition processing chamber while pulsing the deposition precursor gas.

6. The method of claim 5, wherein the purge gas mixture includes $H_2$ gas and Ar gas.

7. The method of claim 1, further comprising:
supplying a pretreatment gas mixture into the metal deposition processing chamber to pretreat the substrate in the metal deposition processing chamber prior to pulsing the deposition precursor gas mixture.

8. The method of claim 7, wherein the pretreatment gas mixture includes at least a hydrogen containing gas and an inert gas.

9. The method of claim 8, wherein the hydrogen containing gas includes at least one of a $H_2$ gas, $H_2O$, gas or a $H_2O_2$ gas.

10. The method of claim 7, wherein the pretreatment gas mixture includes a $H_2$ gas and a Ar gas.

11. The method of claim 7, wherein supplying the pretreatment gas mixture further comprises:
supplying the pretreatment gas mixture from a remote plasma source disposed to the metal deposition processing chamber.

12. The method of claim 1, further comprising:
alternating a process pressure from a first level to a second level from pulsing the deposition precursor gas mixture to pulsing the purge gas mixture, wherein the second level is lower than the first level.

13. The method of claim 12, wherein the first level of the process pressure is between about 7 Torr and about 30 Torr and the second level of the process pressure is between about 0.1 Torr and about 2 Torr.

14. The method of claim 1, wherein the edge of the substrate includes a periphery region of the substrate having a width between about 1 mm and about 5 mm from the substrate edge.

15. The method of claim 4, wherein the cobalt containing precursor is a dicobalt hexacarbonyl butylacetylene supplied with a Ar carrier gas.

16. A method for depositing a contact metal layer for forming a contact structure in a semiconductor device, comprising:
supplying a pretreatment gas mixture into a metal deposition processing chamber to pretreat a surface of a substrate in the metal deposition processing chamber;
pulsing a deposition precursor gas mixture to the surface of the substrate disposed in the metal deposition processing chamber;
pulsing a purge gas mixture to an edge of the substrate, wherein the purge gas mixture includes at least a hydrogen containing gas and an inert gas; and
forming a contact metal layer on the substrate from the deposition precursor gas mixture.

17. The method of claim 16, wherein the substrate includes at least a silicon containing layer disposed thereon having openings formed therein, wherein the contact metal layer is filled in the openings formed in the silicon containing layer.

18. The method of claim 16, wherein supplying the pretreatment gas mixture further comprises:
supplying the pretreatment gas mixture from a remote plasma source disposed to the metal deposition processing chamber.

19. The method of claim 16, wherein the purge gas mixture includes $H_2$ gas and Ar gas.

20. The method of claim 16, wherein the edge of the substrate includes a periphery region of the substrate having a width between about 1 mm and about 5 mm from the substrate edge.

21. A method for depositing a contact metal layer for forming a contact structure in a semiconductor device, comprising:
supplying a pretreatment gas mixture into a metal deposition processing chamber to pretreat a surface of a substrate in the metal deposition processing chamber, wherein the substrate has a silicon containing layer disposed thereon having openings formed in the silicon containing layer, the openings having aspect ratio greater than 20:1;
pulsing a deposition precursor gas mixture to the surface of the substrate disposed in the metal deposition processing chamber;
pulsing a purge gas mixture to an edge of the substrate, wherein the purge gas mixture includes at least a hydrogen containing gas and an inert gas; and
forming a contact metal layer in the openings of the silicon containing layer disposed on the substrate from the deposition precursor gas mixture.

* * * * *

UNITED STATES PATENT AND TRADEMARK OFFICE
CERTIFICATE OF CORRECTION

PATENT NO. : 8,586,479 B2
APPLICATION NO. : 13/356002
DATED : November 19, 2013
INVENTOR(S) : Xinyu Fu et al.

Page 1 of 1

It is certified that error appears in the above-identified patent and that said Letters Patent is hereby corrected as shown below:

In the Specifications:

In Detailed Description of the Invention:

Column 3, Line 52, delete "11d" and insert --lid-- therefor;

Column 5, Line 13, delete "171" and insert --172-- therefor;

Column 7, Line 8, delete "(SOD," and insert --(SOI),-- therefor;

Column 10, Line 40, delete "methyl" and insert --methyl- -- therefor.

Signed and Sealed this
Twenty-fifth Day of February, 2014

Michelle K. Lee
*Deputy Director of the United States Patent and Trademark Office*